US006878646B1

United States Patent
Tsai et al.

(10) Patent No.: US 6,878,646 B1
(45) Date of Patent: Apr. 12, 2005

(54) METHOD TO CONTROL CRITICAL DIMENSION OF A HARD MASKED PATTERN

(75) Inventors: Chao-Tzung Tsai, Hsinchu (TW); Jia-Sheng Wu, Taoyuan (TW); Fuxuan Fang, Douliou (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 0 days.

(21) Appl. No.: 10/272,082

(22) Filed: Oct. 16, 2002

(51) Int. Cl.[7] .......................................... H01L 21/302
(52) U.S. Cl. ...................... 438/947; 438/756; 438/757; 438/745
(58) Field of Search ................. 438/947, 706, 438/717, 738, 736, 751, 743–745, 756, 757

(56) References Cited

U.S. PATENT DOCUMENTS

| 4,959,326 A | * | 9/1990 | Roman et al. ............... 438/574 |
| 5,244,818 A | * | 9/1993 | Jokerst et al. ................. 438/25 |
| 5,792,578 A | * | 8/1998 | Tzu et al. ....................... 430/5 |
| 5,804,088 A | * | 9/1998 | McKee .......................... 216/47 |
| 5,853,960 A | * | 12/1998 | Tran et al. ................... 430/321 |
| 6,060,377 A | | 5/2000 | Xiang et al. ................. 438/585 |
| 6,197,687 B1 | | 3/2001 | Buynoski ..................... 438/671 |
| 6,211,044 B1 | | 4/2001 | Xiang et al. ................. 438/585 |
| 6,235,609 B1 | | 5/2001 | Sengupta et al. ........... 438/424 |
| 6,348,289 B1 | * | 2/2002 | Couteau et al. ............... 430/30 |
| 6,420,097 B1 | * | 7/2002 | Pike et al. ................... 430/313 |
| 6,649,535 B1 | * | 11/2003 | Yu et al. ..................... 438/763 |
| 2003/0096465 A1 | * | 5/2003 | Chen et al. |

OTHER PUBLICATIONS

M. Miyashita et al., "Dependence of Surface Microroughness of CZ, FZ, and EPI Wafers on Wet Chemical Processing", J. Electrochem. Soc., vol. 139, pp. 2133–2142, 1992.

* cited by examiner

*Primary Examiner*—Ha Tran Nguyen

(57) ABSTRACT

A method of reducing the critical dimension (CD) of a hard mask by a wet etch method is described. An oxide hard mask is treated with a $H_2SO_4/H_2O_2$ (SPM) solution followed by treatment with a $NH_4OH/H_2O_2/H_2O$ (APM) solution to trim the CD by 0 to 20 nm. With nitride or oxynitride hard masks, a buffered HF dip is inserted prior to the SPM treatment. For oxide hard masks, the SPM solution performs the etch while APM solution assists in removing plasma etch residues. With oxynitride hard masks, the APM performs the etch while BHF and SPM solutions remove plasma etch residues. The hard mask pattern can then be transferred with a dry etch into an underlying polysilicon layer to form a gate length of less than 150 nm while controlling the CD to within 3 to 5 nm of a targeted value.

35 Claims, 4 Drawing Sheets

METHOD TO CONTROL CRITICAL DIMENSION OF A HARD MASKED PATTERN

FIELD OF THE INVENTION

The invention relates to a method of forming a polysilicon gate in a microelectronic integrated circuit. More particularly, the present invention is directed to the method of controllably wet etching to reduce a critical dimension (CD) of a hard mask.

BACKGROUND OF THE INVENTION

One of the key steps in the manufacture of a semiconductor device is formation of a gate electrode which will hereafter be referred to as the gate. The gate length which is the horizontal measurement between vertical sidewalls of the gate is typically one of the smallest dimensions in the device. The gate length is a critical dimension (CD) since the performance of the resulting device is related to its size. Gate lengths of less than 100 nm are currently required to meet the demand for a faster transistor speed in advanced technologies. A high performance also requires that the gate length or CD must be controlled within a tight specification, typically within a 3 to 5 nm variation across the wafer.

A hard mask is typically an inorganic layer formed on a substrate such as polysilicon to protect the substrate during processes that are used to define a pattern in an overlying photoresist and to provide etch selectivity for transferring the pattern into the substrate during a plasma etch step. Three of the more common hard mask materials are $Si_xO_y$ hereafter referred to as silicon oxide, silicon nitride, and a composite of the formula $Si_xO_yN_z$ hereafter referred to as silicon oxynitride.

A lithography process involving an exposure comprised of one or more wavelengths selected from a range of about 10 nm to about 450 nm is initially used to transfer a pattern from a patterned mask containing opaque regions such as chrome on a transparent substrate like quartz into a photoresist layer. Exposed regions of the photoresist undergo a chemical change that renders them soluble in an aqueous base developer when the photoresist is a positive tone material. Unexposed regions remain insoluble and are not removed by developer. As a result, openings in the photoresist layer expose an underlying layer such as a hard mask. In the example of a gate pattern, photoresist lines separated by spaces of varying width are formed. Subsequent steps involve etch transferring the "gate" pattern through the hard mask layer and using the hard mask to etch the pattern into a polysilicon or amorphous silicon substrate to form gates.

The gate length is typically less than the smallest line width that a photolithography process can print in a photoresist layer. As a result, the photoresist line is typically trimmed with a dry etch process in a plasma tool to reduce the CD of the gate length. Even with a trimming process, the CD is sometimes larger than the desired size for the gate length.

To compensate for the larger CD, a conventional method is to adjust the ion implantation dosage for forming lightly doped source/drain regions which will change the $I_{SAT}$ level. However, if the hard mask etch is not controlled to produce CD values within a tight specification range, then the devices based on varying gate lengths will still have an unacceptable range of performance. Therefore, an improved hard mask etch or trim is needed that can control the final gate length CD to within a tight specification that is typically 3 to 5 nm across a wafer.

U.S. Pat. No. 6,197,687 discloses a process by which the CD of the polysilicon gate is reduced by means of plasma etching a photoresist layer that is positioned under a photoactive layer. A final CD of as small as 70 nm can be achieved. However, no mention is made about the ability to control the CD to within a few nm.

U.S. Pat. No. 6,235,609 discloses a method to controllably reduce the CD of a nitride layer in forming shallow trench isolation regions. Either a phosphoric acid treatment or a dry etch in a plasma may be used. As much as 100 nm can be removed from each edge in this process. However, the ability to control the CD to within 3 to 5 nm is not claimed.

U.S. Pat. Nos. 6,060,377 and 6,211,044 to Advanced Micro Devices, Inc. disclose an annealing process that forms a metal suicide layer on the sidewall of a polysilicon structure. The metal silicide is removed by a wet etch to give a polysilicon CD that is smaller than its original dimension prior to the metal deposition and annealing. However, no details are provided about the amount of CD reduction in nm or how well the CD reduction is controlled.

M. Miyashita, T. Tsuga, K. Makihara, and T. Ohmi describe in "Dependence of Surface Microroughness of CZ, FZ, and Epi Wafers on Wet Chemical Process" in J. Electrochem. Soc., Vol. 139, p. 526 (1992) that $NH_4OH$ acts as an etchant of oxide while $H_2O_2$ acts as the oxidant in a solution consisting of $NH_4OH$, $H_2O_2$, and water, hereafter referred to as "APM". When nitride is exposed to an APM solution, the surface layer is converted into the form of $SiO_xN_y$ which is then removed by reacting with the $NH_4OH$ etchant.

SUMMARY OF INVENTION

An objective of the present invention is to provide a method for reducing the width of a hard mask feature to a size within 3 to 5 nm of a targeted value across a wafer.

A further objective of the present invention is to provide a hard mask etch method that can be controllably reproduced from batch to batch of wafers.

These objectives are achieved forming a hard mask on a polysilicon substrate and then patterning a photoresist on the hardmask which is preferably comprised of $SiO_2$, silicon nitride, or silicon oxynitride. The CD of the photoresist may be reduced with a plasma etch before the pattern is transferred into underlying layers.

In accordance with one embodiment of the invention, the photoresist pattern is transferred through an oxide hard mask by a plasma etch. The photoresist is then stripped with a plasma etch or with a wet stripper. A key feature of the invention is that the hard mask is then wet etched with a solution of sulfuric acid and $H_2O_2$ (SPM) followed by treatment with an APM solution comprised of $NH_4OH$, $H_2O_2$, and water to further reduce the CD of the hard mask. It is believed that the SPM solution does a majority of the etching while the APM solution serves primarily to remove plasma etch residues from a previous step. The lateral etch rate can be controlled with proper dip time and concentration of the SPM and APM solutions such that the final CD of the hard mask is maintained within a 3 to 5 nm variation in size. The life count (number of operations per batch) of APM and SPM solutions is monitored to correlate etch rate as a function of life count. Similarly, etch rate can be determined for a fixed concentration of either SPM or APM solution as a function of temperature during the treatment. The etch rate of the oxide hard mask linearly decreases with higher APM and SPM life counts. The reduced CD of the hard mask is transferred into the polysilicon layer by a plasma etch to form a gate in a largely anisotropic process but a small amount of reduction in CD may occur. Therefore, a wet etch process is employed to further reduce a CD following a plasma etch trim step. This method enables a smaller gate length than is possible by lithography methods alone and provides a high degree of control in forming a smaller gate.

In accordance with another embodiment of the invention, the photoresist pattern is transferred through an oxynitride or nitride hard mask by a plasma etch. The photoresist is stripped with a plasma etch or with a wet stripper. A key feature of the invention is that the hard mask is then wet etched with a sequence consisting of a buffered HF (BHF) dip, treatment with an SPM solution, and a dip in an APM solution. It is believed that the APM solution does a majority of the etching while the BHF and SPM solutions serve primarily to remove plasma etch residues from a previous step. The lateral etch rate can be controlled with proper dip time and concentration of the BHF, SPM, and APM solutions such that the final CD of the hard mask is maintained within a 3 to 5 nm variation in size. The life count (number of operations per batch) of BHF, APM, and SPM solutions is monitored to correlate etch rate as a function of life count. Similarly, etch rate can be determined for a fixed concentration of BHF, SPM, or APM solution as a function of temperature during the treatment. The etch rate of the nitride and oxynitride hard masks linearly increase with higher SPM life count and are constant with higher APM and BHF life counts. The reduced CD of the hard mask is transferred into the polysilicon layer by a plasma etch to form a gate in a largely anisotropic process but a small amount of reduction in CD may occur. Therefore, a wet etch process is employed to further reduce a CD following a plasma etch trim step. This method enables a smaller gate length than is possible by lithography methods alone and provides a high degree of control in forming a smaller gate.

In accordance with another embodiment of this invention, the hard mask may be formed over a substrate other than polysilicon and the patterned hard mask with reduced CD may be dry etch transferred into an underlying layer for making a different part of an integrated circuit other than the gate feature.

DETAILED DESCRIPTION OF THE INVENTION

The present invention has been found to be useful and advantageous in reducing the critical dimension (CD) of a hard mask in a controlled manner so that the plasma etch transfer of the hard mask dimension into an underlying polysilicon layer results in a polysilicon gate feature with a CD controlled to within 3 to 5 nm in variation. This tight control of CD allows the device to have optimum performance in microelectronics applications.

Those skilled in the art will appreciate that this method is not restricted to formation of polysilicon gates but can be applied to other parts of device manufacture as well that employ a hard mask. In general, the process can be used to reduce the CD of any hard mask that contains silicon oxide, silicon nitride, or silicon oxynitride. The hard mask may be removed after the hard mask pattern is plasma etch transferred into an underlying layer or in some cases it may remain in the device if its presence does not detract from the device performance.

Figure 1A:
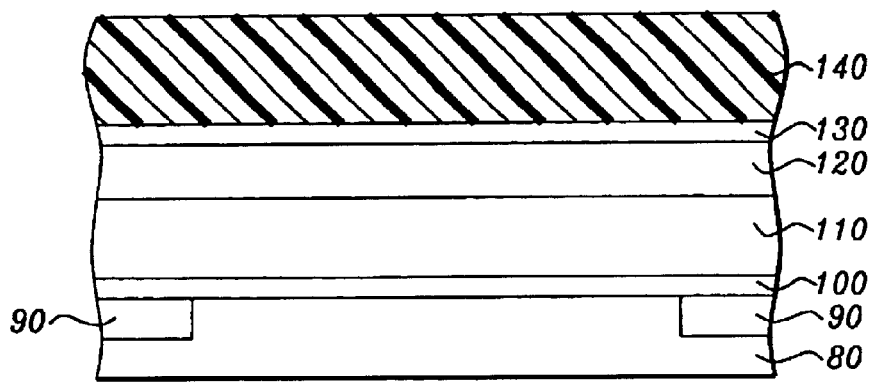
FIG. 1A is a cross-sectional view of various layers employed in the first embodiment.

Referring to FIG. 1A, a cross-sectional view of the various layers used in the present invention is shown. A substrate 80 is provided with isolation regions 90 that are generally comprised of an insulating material such as $SiO_2$. Substrate 80 can also contain active and passive devices that are not shown in order to simplify the drawing. Shallow trench isolation (STI) features 90 formed by a conventional method are shown in FIG. 1A but field oxide (FOX) structures may also be used. The substrate located between the STI features 90 can be doped to form n wells or p wells as an initial step in fabricating a PMOS or NMOS transistor. A thin gate dielectric layer 100 that is comprised of silicon oxide or a high k dielectric material such as $HfO_2$, $ZrO_2$, and $Ta_2O_5$ is deposited on substrate 80 by a chemical vapor deposition (CVD), plasma enhanced CVD (PECVD), atomic layer deposition or metal organic CVD technique.

Next a gate layer 110 is deposited by a CVD or PECVD method on gate dielectric layer 100. Generally, gate layer 110 is comprised of polysilicon or amorphous silicon and may be doped. A hard mask 120 is then formed on the gate layer 110 by a CVD, PECVD, or spin-on method and may be comprised of silicon oxide, silicon nitride, or silicon oxynitride. The thickness of the hard mask is in the range of about 20 nm to about 200 nm. An organic or inorganic anti-reflective coating (ARC) 130 may be employed to reduce reflectivity off the hard mask during a subsequent patterning step. A typical ARC 130 thickness is in the range of 30 to about 100 nm. A photoresist is spin coated and baked to form a photoresist layer 140 typically between 200 and 750 nm thick, and preferably having a thickness not more than about 3 or 4 times the size of gate length L1 to be formed in photoresist layer 140 in a patterning step in order to prevent pattern collapse during aqueous base development and DI water rinse steps.

Figure 1B:
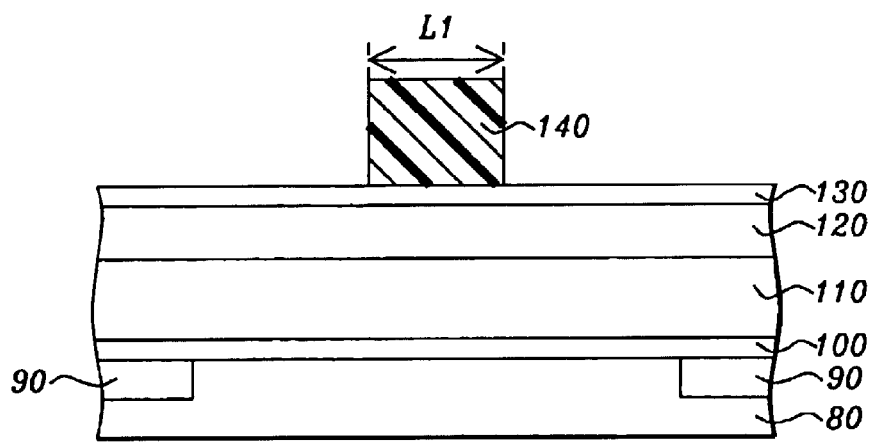
FIG. 1B is a cross-sectional view of the partially formed transistor after a photoresist patterning step.

Referring to FIG. 1B, the photoresist layer 140 is patterned by conventional means to produce a feature with a critical dimension (CD) shown as L1. The photoresist CD L1 for current technologies is in the range of about 100 to 250 nm and in advanced technologies the photoresist CD L1 will be smaller than 100 nm. The ARC layer 130 may be useful in reducing the variation in the photoresist CD L1 by minimizing the variation in reflectivity of the exposing light off the hardmask 120 caused by thickness variations of the hard mask. The ARC 130 may also function as a chemical barrier when silicon nitride or silicon oxynitride is employed as hard mask 120 in order to prevent trace amounts of amines in hard mask 120 from diffusing into photoresist layer 140 and poisoning the chemical reaction initiated by the exposure. Most patterning processes involve one or more exposure wavelengths selected from a range of about 10 nm to about 450 nm. Smaller wavelengths enable a smaller photoresist CD L1 to be formed. Those skilled in the art will recognize that other exposure sources such as electron beam, ion beam, and X-rays can also be employed to generate patterns in photoresist layer 140.

Figure 1C:
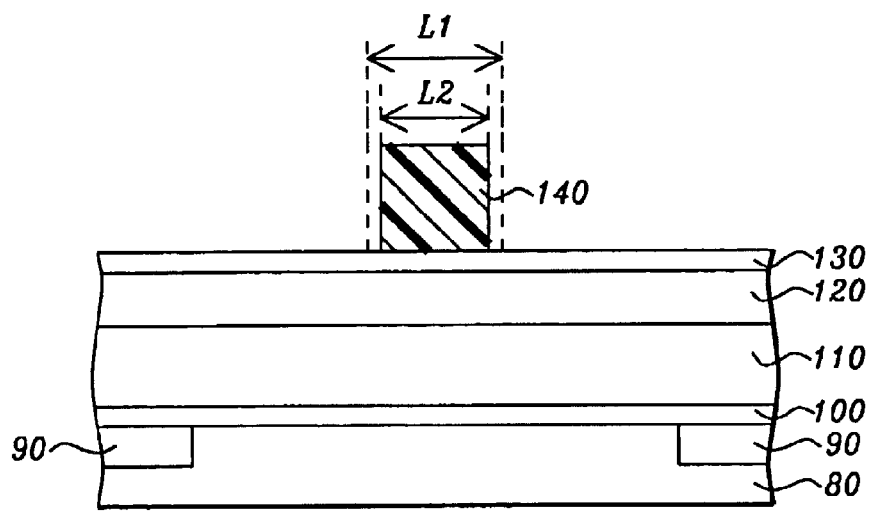
FIG. 1C is a cross-sectional view showing a reduction in CD of the photoresist pattern in FIG. B by means of a plasma etch.

Referring to FIG. 1C, the desired gate length for gate 110 is usually smaller than the minimum photoresist CD L1 that a photoresist patterning step can provide. The gate length photoresist CD L1 can be reduced by a plasma etch to give a reduced CD L2 in photoresist pattern 140 which is smaller than photoresist CD L1. This etch may or may not remove the underlying ARC layer 130 exposed by the photoresist pattern 140. Those skilled in the art are familiar with the types of etch processes including gases and flow rates that are used to "trim" the photoresist in a lateral direction as shown in FIG. 1C.

Figure 1D:
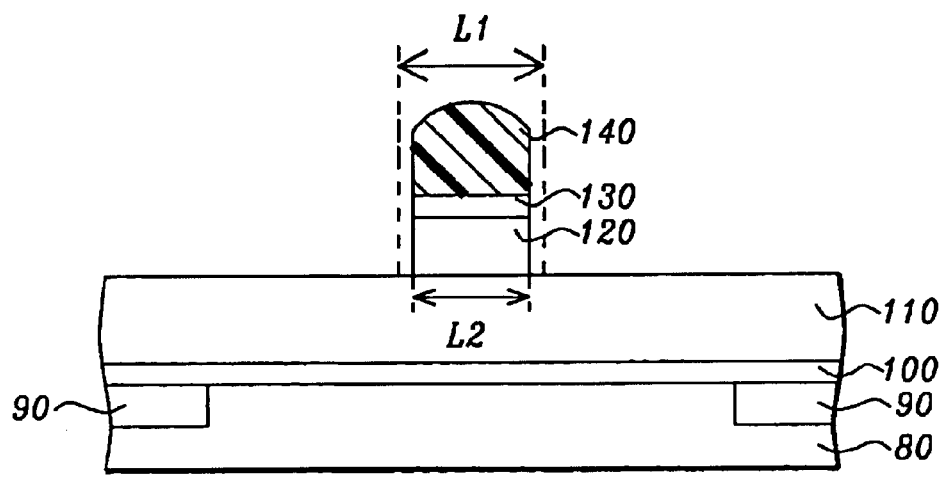
FIG. 1D is a cross-sectional view of the structure in FIG. 1C after the pattern is transferred into an underlying hard mask.

Referring to FIG. 1D, a plasma etch is performed to transfer the pattern from the photoresist pattern 140 through the ARC layer 130 and through the hard mask 120. The etch conditions for this step are well known to those who fabricate microelectronic devices. FIG. 1D suggests that some top loss and rounding of the photoresist pattern 140 typically occurs during this etch step. The reduced CD L2 has been anisotropically transferred into the hard mask 120 with no lateral bias.

Figure 1E:
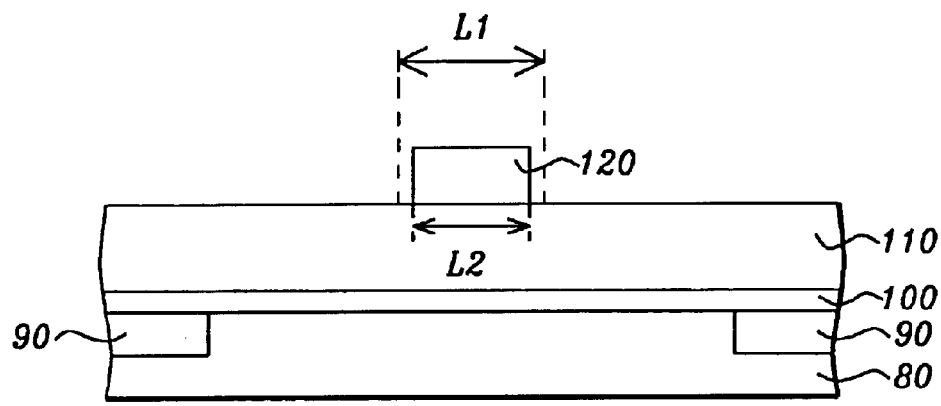
FIG. 1E shows the hard mask pattern in FIG. 1D after the photoresist is stripped.

In FIG. 1E, the photoresist pattern 140 and any ARC layer 130 are stripped either with a wet photoresist stripper or with a plasma etch. The reduced CD L2 in the hard mask 120 is unchanged. The process up to this point has been practiced in prior art.

Figure 1F:
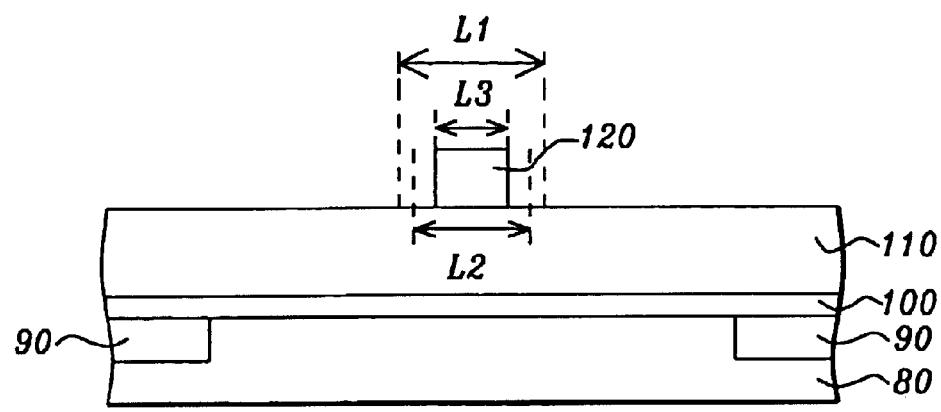
FIG. 1F is a cross-sectional view showing a further reduction in hard mask CD by means of a wet etch.

Referring to FIG. 1F, a key feature of the invention is a wet etch that is performed to further decrease the CD of hard mask 120 in a controllable manner to a size labeled L3. When the hard mask 120 is comprised of silicon oxide, substrate 80 is first treated with an SPM solution ($H_2SO_4$ and $H_2O_2$). The ratio of $H_2SO_4$ to $H_2O_2$ is typically 4:1 but can be greater than 4:1. The temperature of the solution is preferably 125° C. to 130° C. but can range from about 60° C. to about 150° C. The dip time, temperature and concentration ratio may be varied in order to maintain a constant etch rate from wafer to wafer since the SPM etch rate linearly decreases with life count (number of wafers that have been processed through a batch of SPM solution). In actual practice, the SPM treatment may be comprised of more than one dip into an SPM solution in order to improve throughput. By monitoring and measuring enough wafers, a relationship of SPM life count vs. etch rate and temperature vs. etch rate can be determined to maintain a constant and controllable etch rate during the lifetime of the SPM etchant solution. The wafer is normally rinsed with DI water and dried before proceeding to a second wet etch step.

In a second step, the wafer is dipped into an APM solution consisting of $NH_4OH$, $H_2O_2$, and water. It should be noted that for an oxide hard mask 120, the SPM treatment is believed to be the primary etchant that reduces CD L2 to L3 while the APM treatment is generally used to remove any residues from the previous plasma etch step. The preferred ratio of $NH_4OH$, $H_2O_2$, and water is from 1:4:20 to 1:2:50, respectively. The APM concentration, temperature, and dip time may be changed during successive processes in order to maintain an efficient removal of etch residue and to maintain a constant etch rate. For example, the inventors have found that the oxide etch rate linearly decreases with a higher APM life count. A preferred temperature range is from about 35° C. to about 50° C. but a range of about 15° C. to 75° C. is useful in the present invention. Typically, the thickness of the oxide hard mask 120 is in the range of 20 to 200 nm and the reduction in thickness (L3–L2) for the combined SPM and APM etch steps is in the range of 0 to 20 nm and preferably is in the range of about 1 to 5 nm. The method of this embodiment is an advantage over prior art since the hard mask can be controllably trimmed from an L2 dimension to L3 while maintaining L3 within 3 to 5 nm of a targeted value. Furthermore, the etch treatment cleans the substrate unlike the case where a plasma etch is the final step in trimming a CD and subsequent cleaning processes are required.

Figure 1G:
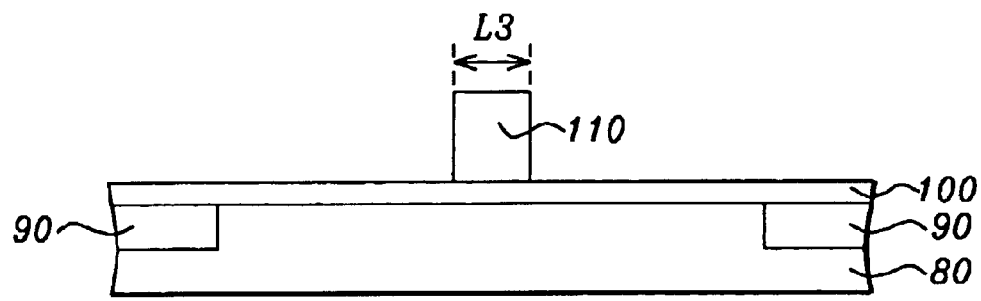
FIG. 1G is a cross-sectional view of the structure in FIG. 1F after the pattern is transferred into an underlying gate layer and the hard mask is removed.

Referring to FIG. 1G, the pattern in hard mask 120 with a CD L3 is etch transferred by a conventional method into gate layer 110 to form a gate length L3. The hard mask 120 may be removed by a standard method after the gate 110 is formed or may remain in the device. The etch may be optimized so that CD (L3) is transferred into gate layer 110 with little or no further etch bias. Therefore, the advantage of the present invention is that it produces a final gate length which can be controlled to within 3 to 5 nm of a target value for the particular device. Another feature of this invention is that a CD (L3) can be produced that is smaller than the photoresist CD (L1) or by trimming a photoresist image with a dry etch to give a reduced CD (L2).

In another embodiment where the hard mask is silicon oxynitride or silicon nitride, the treatment steps described above for the oxide hard mask are preceded by a wet etch step in buffered HF (BHF). Substrate 80 is dipped in a BHF solution (1:100 HF/water) for a period of 5 to 60 seconds at a temperature range of from 20° C. to 50° C. and preferably at 23° C. A typical etch rate for the BHF dip is about 0.05 nm per second. During this dip, the BHF also helps to remove any plasma etch residues from a previous step. A oxynitride or nitride etch rate in BHF is independent of life count. The substrate 80 is normally rinsed with DI water and dried before proceeding to the next treatment.

The substrate 80 is then dipped in the SPM solution described previously for a period of 0 to about 3600 seconds at a temperature in the range of about 60° C. to about 150° C., and preferably in the range of 125° C. to 130° C. The ratio of $H_2SO_4$ to $H_2O_2$ is preferably 4:1 but can be greater than 6:1. In this case the SPM treatment is believed to have a minor role in the lateral etch and assists primarily in cleaning the surface of any plasma etch residue. The SPM temperature, time of dip and ratio of $H_2SO_4$ to $H_2O_2$ may be altered from one wafer to the next in order to control the effectiveness of the treatment since the inventors have found that the etch rate linearly increases with SPM life count.

Figure 2:
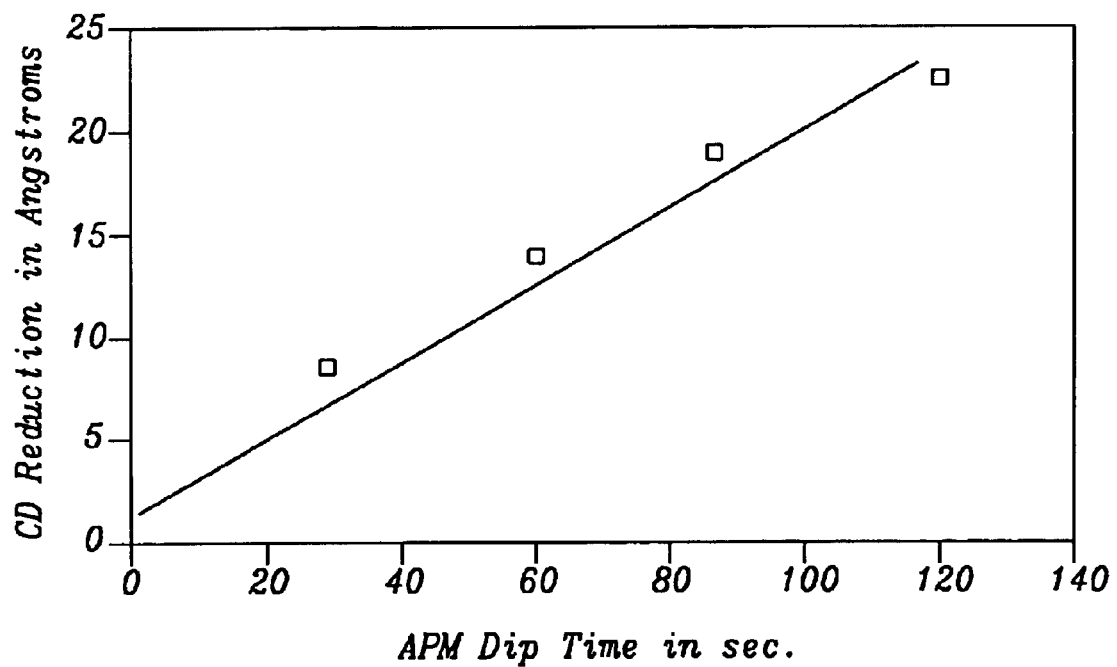
FIG. 2 is a graph showing the relationship of dip time in an APM solution vs. hard mask CD reduction in Angstroms.

Next, substrate 80 is dipped in an APM solution described previously for a period of 0 to about 600 seconds at a temperature in the range of about 15° C. to about 75° C., and preferably in the range of 35° C. to 50° C. The ratio of $NH_4OH:H_2O_2:H_2O$ is from 1:1:1 to about 1:5:125, respectively, and preferably in the range of 1:2:50 to about 1:4:20. In this case, the etch rate the oxynitride or nitride hard mask 120 is independent of life count of the APM solution. FIG. 2 demonstrates the linear relationship of dip time in the APM solution to reduction in CD for an oxynitride hard mask. On average, the CD becomes 6 Angstroms (0.6 nm) smaller per 30 second dip time. The overall reduction in CD (L3–L2) is in the range of 0 to 12 nm, and preferably from 0 to 5 nm. The method of this embodiment is an advantage over prior art in that the size of a nitride or oxynitride hard mask can be trimmed from a dimension L2 to L3 while maintaining L3 within 3 to 5 nm of a target value. Furthermore, the etch treatment cleans the substrate unlike the case where a plasma etch is the final step in trimming a CD and subsequent cleaning processes are required.

Referring to FIG. 1G, the pattern in hard mask 120 with a CD L3 is etch transferred by a conventional method into gate layer 110 to form a gate length L3. The hard mask 120 may be removed by a standard method after the gate 110 is formed or may remain in the device. The etch may be optimized so that CD (L3) is transferred into gate layer 110 with little or no further etch bias. Therefore, the advantage of the present invention is that it produces a final gate length which can be controlled to within 3 to 5 nm of a target value for the particular device. Another feature of this invention is that a CD (L3) can be produced that is smaller than the photoresist CD (L1) or by trimming a photoresist image with a dry etch to give a reduced CD (L2).

Figure 1H:
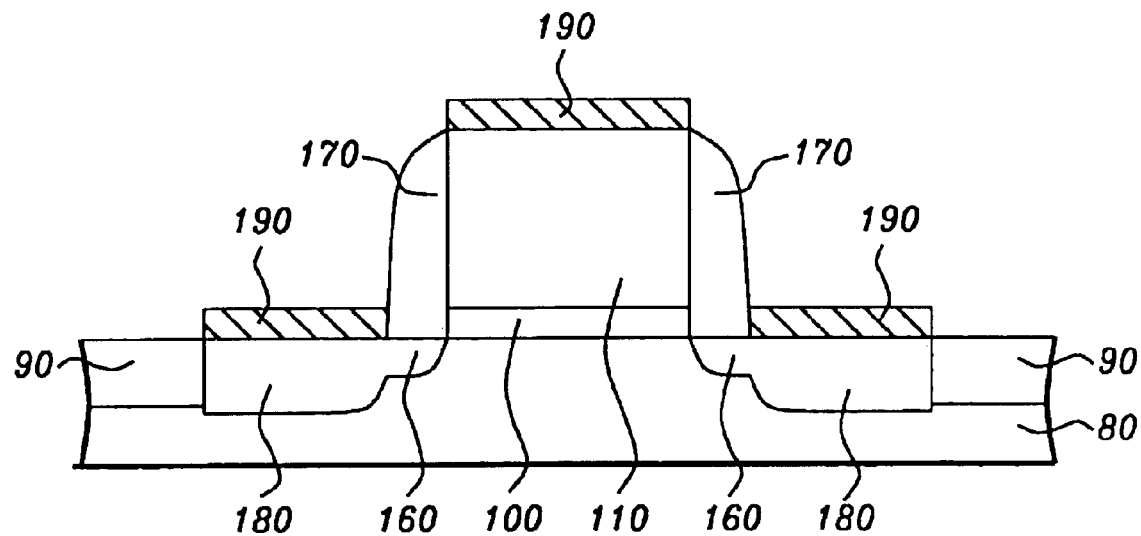
FIG. 1H is a cross-sectional view of the structure in FIG. 1G after a transistor is fabricated.

Referring to FIG. 1H, the process may be further comprised of forming a transistor 150 between STI regions 90 by removing exposed regions of gate dielectric layer 100, forming lightly doped source/drain (S/D) regions 160 in the substrate, forming spacers 170 on the sidewalls of gate electrode 110 and on dielectric layer 100, forming heavily doped S/D regions 180 in substrate 80, and performing a silicidation to produce silicide regions 190 on gate electrode 110 and on heavily doped S/D regions 180. Since the gate length L3 has been tightly controlled to within 3 to 5 nm of a target specification, the resulting transistor provides optimum performance.

EXAMPLE 1

Wet Etch Process of an Oxide Hard Mask

A patterned substrate that was processed through the etch transfer step into a 500 Angstrom thick oxide hard mask as shown in FIG. 1E was taken through the following steps. A substrate with a hard mask CD L2 of 149 nm was dipped in an SPM solution with a $H_2SO_4:H_2O_2$ ratio of 4:1 at 130° C. for 1800 seconds. This process was repeated two more times at the same concentration, dip time and temperature. The substrate was rinsed with 800 ml of deionized water and dried by a Maragoni dryer for 600 seconds. The resulting hard mask CD (L3) was measured to be 147 nm. The substrate was then dipped in an APM solution with a $NH_4OH:H_2O_2:H_2O$ ratio of 1:4:20 at 50° C. for 60 seconds and rinsed with 800 ml of deionized water and dried by a Maragoni dryer for 600 seconds. The resulting hard mask CD (L3) was 147 nm with a CD variation of +/−2 nm. The substrate was then etched with a standard polysilicon gate dry etch to transfer the pattern with dimension L3 into the underlying polysilicon layer. The resulting dimension of the polysilicon gate after etch transfer was 140 nm with a CD variation of +/−3 nm.

EXAMPLE 2

Wet Etch Process of an Oxynitride Hard Mask

A patterned substrate that was processed through the etch transfer step into an 500 Angstrom thick oxynitride hard mask 120 as shown in FIG. 1E was taken through the following steps. The substrate with a hard mask CD L2 of 150 nm was dipped in a buffer HF (BHF) solution (1:100 HF :$H_2O$) at 23° C. for 15 seconds and then rinsed with 800 ml of DI water and dried by a Maragoni dryer for 600 seconds. The substrate was then dipped in an SPM solution with a $H_2SO_4:H_2O_2$ ratio of 4:1 at 50° C. for 1800 seconds. The SPM treatment was repeated two more times at the same concentration, dip time and temperature. The wafer was rinsed with 800 ml of deionized water and dried by a Maragoni dryer for 600 seconds. The resulting hard mask CD (L3) was measured to be 149 nm. The substrate was next dipped in an APM solution with a $NH_4OH:H_2O_2:H_2O$ ratio of 1:4:20 at 50° C. for 180 seconds and rinsed with 800 ml of DI water and dried by a Maragoni dryer for 600 seconds. The resulting CD (L3) of the hard mask was 146 nm with a CD variation of +/−1 nm. The substrate was then etched with a standard polysilicon gate dry etch to transfer the pattern with dimension L3 into the underlying polysilicon layer. The resulting dimension of the polysilicon gate after etch transfer was 139 nm with a CD variation of +/−3 nm.

While this invention has been particularly shown and described with reference to, the preferred embodiments thereof, it will be understood by those skilled in the art that various changes in form and details may be made without departing from the spirit and scope of this invention.

We claim:

1. A method of controllably reducing a hard mask critical dimension (CD) in an integrated circuit comprising the steps of:
   (a) providing a substrate with a hard mask layer comprised of silicon nitride, silicon oxide, or silicon oxynitride formed thereon;
   (b) patterning a photoresist film on said hard mask forming a pattern having a photoresist CD;
   (c) dry etching to transfer said pattern into said hard mask forming a hard mask pattern having a hard mask CD; and
   (d) wet etching the hard mask to laterally reduce the hard mask CD of said hard mask pattern by dip treatments comprising dipping said substrate in a first (SPM) solution of sulfuric acid and hydrogen peroxide and then dipping in a second (APM) solution comprised of ammonium hydroxide, hydrogen peroxide, and water.

2. The method of claim 1 wherein the hard mask is a silicon oxide layer with a thickness from about 20 to 200 nm and said hard mask CD is about 150 nm or less.

3. The method of claim 1 further comprised of trimming the photoresist CD by a plasma etch before transferring said pattern into said hard mask.

4. The method of claim 1 further comprised of removing said pattern after said dry etching to transfer said pattern into said hard mask before said wet etch.

5. The method of claim 1 further comprised of rinsing said substrate with deionized water and drying after completing the dip treatment with said SPM solution and after the dip treatment with said APM solution.

6. The method of claim 1 wherein the lateral reduction in said hard mask CD during the wet etch is from 0 to 20 nm.

7. The method of claim 1 wherein the lateral reduction in said hard mask CD during the wet etch is controlled to within 3 to 5 nm of a target value.

8. The method of claim 1 wherein the $H_2SO_4:H_2O_2$ ratio is 4:1 or >4:1 in said SPM solution and said dip in said SPM solution is performed in a temperature range from about 60° C. to 150° C. for 0 to about 3600 seconds.

9. The method of claim 8 further comprised of repeating said dip in said SPM solution two more times at a temperature between about 125° C. and 130° C. for 0 to 3600 seconds before rinsing and drying and proceeding to the APM solution.

10. The method of claim 1 wherein the $NH_4OH: H_2O_2: H_2O$ ratio in said APM solution is from about 1:2:50 to about 1:4:20 and said dip in said APM solution is performed in a temperature range of 35° C. to about 50° C. for 0 to about 600 seconds.

11. The method of claim 1 wherein the hard mask is silicon nitride or silicon oxynitride with a thickness from about 20 to 200 nm and said hard mask CD is 150 nm or less.

12. The method of claim 11 further comprised of an additional dip into a buffered HF (BHF) solution followed by rinsing with DI water and drying which is performed after the dry etching step and before dipping into said SPM and APM solutions.

13. The method of claim 12 wherein the lateral reduction in said hard mask CD during the wet processing steps is from 0 to 20 nm.

14. The method of claim 12 wherein the lateral reduction in said hard mask CD during the wet etch can be controlled to within 3 to 5 nm of a target value.

15. The method of claim 12 wherein the BHF solution is comprised of 1 part HF and 100 parts $H_2O$ and said dip treatment in said BHF solution is performed at 23° C. for a period of about 5 to 60 seconds.

16. The method of claim 12 wherein the $H_2SO_4: H_2O_2$ ratio is 4:1 or >4:1 in said SPM solution and said dip in said SPM solution is performed in a temperature range from about 60° C. to 150° C. for 0 to about 3600 seconds.

17. The method of claim 12 further comprised of repeating said dip in said SPM solution two more times at a temperature between about 125° C. and 130° C. for 0 to 3600 seconds before rinsing and drying and proceeding to said APM solution.

18. The method of claim 12 wherein the $NH_4OH: H_2O_2: H_2O$ ratio in said APM solution is from about 1:2:50 to 1:4:20 and said dip in said APM solution is performed in a temperature range of 35° C. to about 50° C. for a period of 0 to about 600 seconds.

19. A method of forming a gate in a transistor comprising:

(a) providing a substrate with a stack formed thereon, said stack comprising a lower gate dielectric layer, a middle gate layer, and an upper hard mask layer comprised of silicon nitride, silicon oxynitride, or silicon oxide;

(b) patterning a photoresist film on said hard mask forming a pattern having a photoresist CD;

(c) dry etching to transfer said pattern into said hard mask forming a hard mask pattern having a hard mask CD;

(d) wet etching the hard mask to laterally reduce the hard mask CD of said hard mask pattern by dip treatments comprising dipping said substrate in a first (SPM) solution of sulfuric acid and hydrogen peroxide and then dipping in a second (APM) solution comprised of ammonium hydroxide, hydrogen peroxide, and water; and (e) etch transferring said reduced hard mask CD pattern into said gate layer.

20. The method of claim 19 wherein said gate layer is comprised of polysilicon or amorphous silicon.

21. The method of claim 19 wherein the hard mask is a silicon oxide layer with a thickness from about 20 to 200 nm and said hard mask CD is about 150 nm or less.

22. The method of claim 19 further comprised of trimming the photoresist CD by a plasma etch before transferring said pattern into said hard mask.

23. The method of claim 19 further comprised of removing said pattern after said dry etching to transfer said pattern into said hard mask and before said wet etch.

24. The method of claim 19 further comprised of rinsing said substrate with deionized water and drying after completing the dip treatment with said SPM solution and after the dip treatment with said APM solution.

25. The method of claim 19 wherein the lateral reduction in said hard mask CD during the wet etch is from 0 to 20 nm.

26. The method of claim 19 wherein the lateral reduction in said hard mask CD during the wet etch can be controlled to within 3 to 5 nm of a target value.

27. The method of claim 19 wherein the $H_2SO_4: H_2O_2$ ratio is 4:1 or >4:1 in said SPM solution and said dip in said SPM solution is performed in a temperature range from about 60° C. to 150° C. for 0 to about 3600 seconds.

28. The method of claim 19 wherein the $NH_4OH: H_2O_2: H_2O$ ratio in said APM solution is from about 1:2:50 to 1:4:20 and said dip in said APM solution is performed in a temperature range of 35° C. to about 50° C. for 0 to about 600 seconds.

29. The method of claim 19 wherein the hard mask is silicon nitride or silicon oxynitride with a thickness from about 20 to 200 nm and said hard mask CD is about 150 nm or less.

30. The method of claim 29 further comprised of an additional dip into a buffered HF (BHF) solution followed by rinsing with DI water and drying which is performed before dipping into said SPM and APM solutions.

31. The method of claim 30 wherein the BHF solution is comprised of 1 part HF and 100 parts $H_2O$ and said dip treatment in said BHF solution is performed at 23° C. for about 5 to 60 seconds.

32. The method of claim 30 wherein the $H_2SO_4: H_2O_2$ ratio is 4:1 or >4:1 in said SPM solution and said dip in said SPM solution is performed in a temperature range from about 60° C. to 150° C. for 0 to about 3600 seconds.

33. The method of claim 30 wherein the $NH_4OH: H_2O_2: H_2O$ ratio in said APM solution is from about 1:2:50 to about 1:4:20 and said dip in said APM solution is performed in a temperature range of 35° C. to about 50° C. for a period of 0 to about 600 seconds.

34. The method of claim 19 wherein the gate CD following etch transfer of the hard mask pattern can be controlled to within 3 to 5 nm of a target value.

35. The method of claim 19 further comprised of fabricating a transistor by adding the steps of forming lightly doped source/drain (S/D) regions, forming spacers on sidewalls of said gate and said gate dielectric layer, forming heavily doped S/D regions, and performing a silicidation to provide suicide regions on said gate electrode and above said heavily doped S/D region.

* * * * *

UNITED STATES PATENT AND TRADEMARK OFFICE
CERTIFICATE OF CORRECTION

PATENT NO. : 6,878,646 B1
DATED : April 12, 2005
INVENTOR(S) : Chao-Tzung Tsai et al.

It is certified that error appears in the above-identified patent and that said Letters Patent is hereby corrected as shown below:

Column 10,
Line 55, delete "suicide" and insert -- silicide --.

Signed and Sealed this

Thirtieth Day of August, 2005

JON W. DUDAS
*Director of the United States Patent and Trademark Office*